US005650632A

United States Patent [19]
Coufal et al.

[11] Patent Number: 5,650,632
[45] Date of Patent: Jul. 22, 1997

[54] FOCAL PLANE PHASE-SHIFTING LITHOGRAPHY

[75] Inventors: Hans Juergen Coufal; Robert Keith Grygier, both of San Jose, Calif.

[73] Assignee: International Business Machines Corporation, Armonk, N.Y.

[21] Appl. No.: 647,485

[22] Filed: May 14, 1996

Related U.S. Application Data

[63] Continuation of Ser. No. 365,279, Dec. 28, 1994, abandoned.

[51] Int. Cl.$^6$ .................................................. G21K 5/04
[52] U.S. Cl. .................................................. 250/492.2
[58] Field of Search .......................... 250/492.2, 492.1; 355/71; 359/573, 569, 566

[56] References Cited

U.S. PATENT DOCUMENTS

| | | | |
|---|---|---|---|
| 3,629,598 | 12/1971 | Brandt | 350/162 |
| 3,995,948 | 12/1976 | Abe et al. | 350/3.5 |
| 4,835,088 | 5/1989 | Gilson | 430/323 |
| 4,947,413 | 8/1990 | Jewell et al. | 378/34 |
| 5,144,362 | 9/1992 | Kamon et al. | 355/53 |
| 5,323,208 | 6/1994 | Fukuda et al. | 355/53 |
| 5,424,153 | 6/1995 | Asai | 430/5 |
| 5,488,229 | 1/1996 | Elliott et al. | 250/492.2 |

FOREIGN PATENT DOCUMENTS

| | | |
|---|---|---|
| 503 472 A2 | 9/1902 | European Pat. Off. . |
| 62-224106 | 12/1994 | Japan . |
| 1027669 | 7/1983 | U.S.S.R. . |
| 1072074 | 7/1984 | U.S.S.R. . |

OTHER PUBLICATIONS

"Optical Lithography for 256Mbit Devices", Electronic Engineering, vol. 65, No. 798, Jun. 1993, pp. 105 & 107.
J. G. Maltabes, Area Neutral Density Filter for Projection Aligners, IBM Tech. Disclosure Bul. vol. 27, No. 6, Nov. 1984.

R. Feder et al., Projection of Lines by Use of Edge Enhancement, IBM Tech. Disclosure Bul., vol. 13, No. 3, Aug. 1970.

M. D. Levenson et al., Phase–Shifting Mask Strategies: Isolated Bright Contacts, Microlithography World, pp. 7–10, May/Jun. 1992.

P. Burggraaf, Senior Ed. Lithography's Leading Edge, Part 1: Phase–Shift Technology, Semiconductor International, pp. 43–47, Feb. 1992.

Levenson et al., "Improving Resolution in Photolithography with a Phase–shifting Mask", IEEE Transactions on Electron Devices, vol. ED–29, No. 12, Dec. 1982, pp. 1828–1836.

Levenson, "Phase–shifting Mask Strategies: Line–space Patterns", Microlithography World, Sep./Oct. 1992, pp. 6–12.

Schellenberg et al., "Optimization of Real Phase Mask Performance", IBM Research Report RJ 8395, Oct. 9, 1991, pp. 1–23.

Terasawa et al., "Imaging Characteristics of Multi–phase–shifting and Halftone Phase–shifting Masks", Japanese Journal of Applied Physics, vol. 30, No. 11B, Nov. 1991, pp. 2991–2997.

*Primary Examiner*—Jack I. Berman
*Assistant Examiner*—Kiet T. Nguyen
*Attorney, Agent, or Firm*—Robert B. Martin

[57] ABSTRACT

A lithographic system for patterned exposure of radiation-sensitive resist. The system comprises a radiation source, a mask, a converging optical element having a focal plane, and a phase-shifting optical element disposed at the focal plane of the converging optical element. The lithographic system produces enhanced images.

4 Claims, 20 Drawing Sheets

FOCAL PLANE PHASE-SHIFTING LITHOGRAPHY

This is a continuation of application Ser. No. 08/365,279 filed on Dec. 28, 1994, now abandoned.

TECHNICAL FIELD

This invention generally relates to a lithography imaging system and, more particularly, to an optical focal plane phase-shifting element used in conjunction with a conventional lithographic transmission mask to produce enhanced images.

BACKGROUND OF THE INVENTION

There is a need for lithographic technologies that can produce features on semiconductors that are below half a micron in dimension. Currently, there are three competing technologies that may be used to accomplish this: X-ray, deep-uv (ultraviolet), and phase-shifting masks. Compared to the conventional lithography for semiconductor processing, the X-ray and deep-uv technologies are conceptually distinct and practically in need of new steppers, elements, resists, etc. In addition to escalating costs, these technologies are often plagued with reliability issues and, in particular, with respect to lasers and synchrotrons as the light source.

Phase-shifting techniques show considerable promise for extending the submicron performance of the state-of-the-art optical lithographic tools. The prospect of avoiding the costs and complexity of developing new lithographic processes and new capital equipment has in recent years provided great incentives for investigation into phase-shifting techniques. In phase-shifting technology, a layer of appropriate width, thickness, and shape is added to each element of a conventional transmission mask. The phase shift caused by this layer, as well as the subsequent interference between the phase-shifted light and the nonphase-shifted light transmitted through the respective parts of the mask for each element, greatly improves the contrast of the projected image of that element. Phase shifting results in enhanced optical resolution which allows smaller elements to be projected. However, one or more appropriately shaped phase-shifting components has to be added for every element to be projected. For example, to produce a 64-megabit DRAM, tens of millions of phase-shifting elements have to be incorporated in the phase-shifting masks used to produce this device. Being extremely complex, these masks are difficult to design, fabricate, inspect, and repair. For general references on conventional phase-shifting techniques see, for example, Levenson et al., "Improving Resolution in Photolithography with a Phase-shifting Mask", *IEEE Transactions On Electron Devices*, Vol. ED-29, No. 12, pp. 1828–1836, December 1982; and Levenson, "Phase-shifting Mask Strategies: Line-space Patterns", *Microlithographic World*, Vol. 1, No. 4, pp. 6–12, September/October 1992, which references are incorporated herein by reference.

An example of a prior art lithography system is disclosed in U.S. Pat. No. 4,947,413. This patent discloses a lithography system capable of doubling the spatial frequency resolution associated with conventional systems. An aperture filter is positioned to intercept the Fourier transform of the mask being exposed. The filter is configured to block certain orders of the diffraction pattern from reaching the wafer. The remaining orders reaching the wafer will produce a cosine-type interference pattern with a period half of the period. There still is a need in the art for a lithographic imaging system which produces enhanced images of intricate patterns.

It is an object of the present invention to provide a lithographic imaging system which produces enhanced images.

Other objects and advantages will be apparent from the following disclosure.

SUMMARY OF THE INVENTION

The present invention relates to a lithographic system for patterned exposure of radiation-sensitive resist. The system comprises a radiation source, a mask, a converging optical element having a focal plane, and a phase-shifting optical element disposed at the focal plane of the converging optical element. The lithographic system produces enhanced images.

A more thorough disclosure of the present invention is presented in the detailed description which follows and the accompanying figures.

DESCRIPTION OF THE PREFERRED EMBODIMENT

Figure 1A:
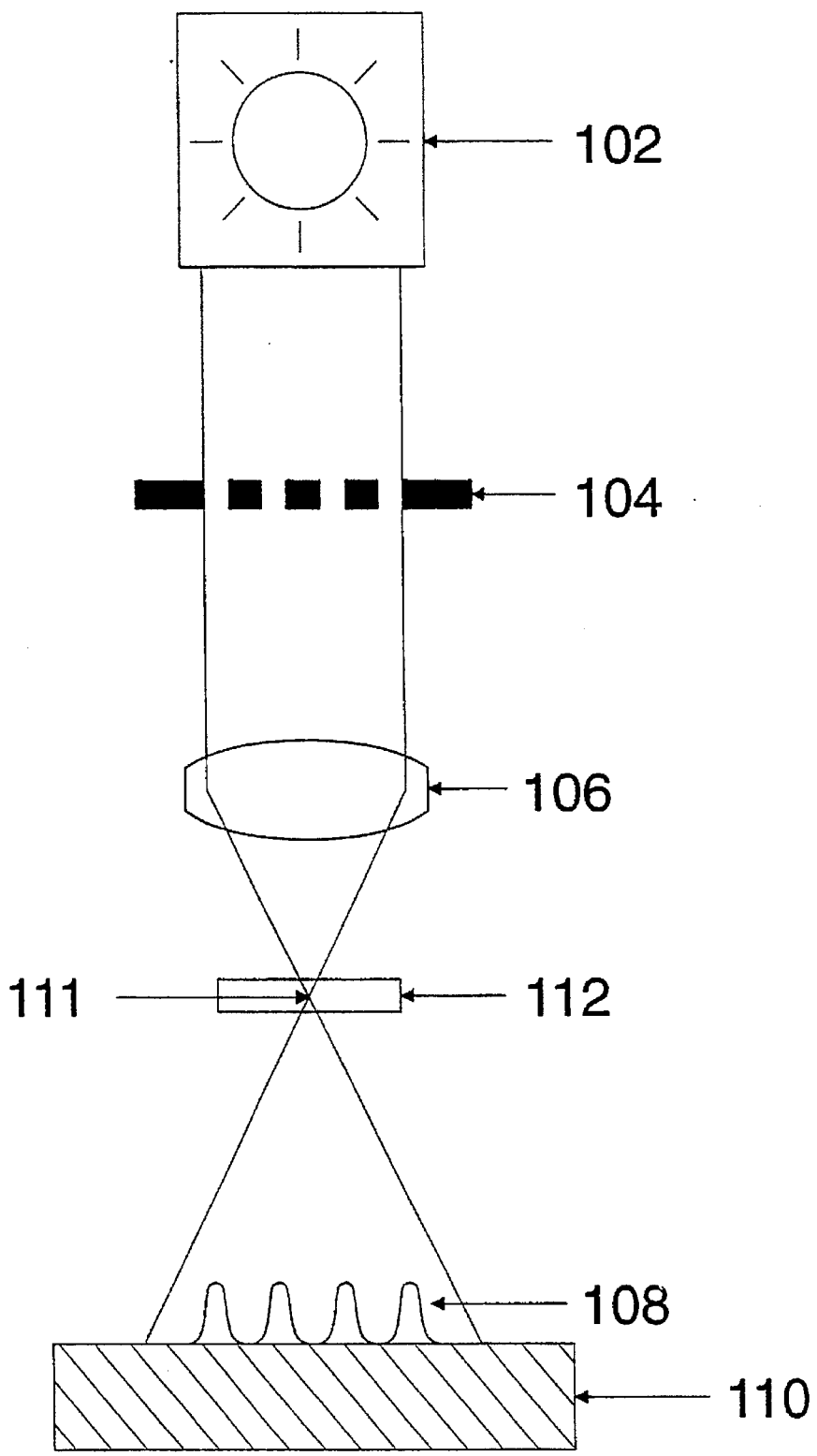
FIG. 1A is a schematic representation of a lithographic system incorporating a phase-shifting optical element at the focal plane.

Referring to FIG. 1A, there is shown an embodiment of the lithographic imaging system of the present invention. The imaging system generally comprises a conventional imaging system having a phase-shifting optical element disposed at the focal plane of the converging optical element. In FIG. 1A, a source of radiation (e.g., a light source) 102 is shown illuminating mask 104. Suitable radiation includes electromagnetic or electron beam radiation, preferably electromagnetic, preferably ultraviolet or X-ray, and more preferably ultraviolet radiation at a wavelength of about 248–365 nm. Suitable radiation sources include mercury, mercury/xenon, and xenon lamps, excimer laser, electron beam, or X-ray. Suitable masks include transmission masks comprising patterned opaque and transmissive regions optionally provided with phase-shifting regions. Suitable masks for use in lithography are well known to those skilled in the art.

The mask 104 is imaged through a converging optical element 106 to produce a lithographic image 108 on a substrate 110. Suitable converging optical elements include transparent converging lenses and reflective optics, e.g., parabolic mirrors which deviate the direction of incident light to a Fourier plane. Suitable converging optical elements are known to those skilled in the art such as those disclosed in Meyer, *Encyclopedia of Physical Science and Technology*, Vol. 9, 1987, the disclosure of which is incorporated herein by reference.

A Fourier transform of the spatial frequencies of the radiation is produced at the focal plane 111 of the converging optical element 106. To generate phase-shifting characteristics, a phase-shifting optical element 112 is disposed in the focal plane of the converging optical element 106. The phase-shifting optical element 112 is designed to shift spatial frequency components at the focal plane such that the image 108 will exhibit enhanced resolution, greater contrast, and a larger depth of focus. Generally, a transmission mask 104 used in semiconductor manufacture has a large number of features with repetitive elements such as parallel lines, and therefore the number of spatial frequency components in the radiation is small in comparison with the total number of features in the transmission mask 104.

The focal plane phase-shifting optical element 112 produces phase shifts for spatial frequency components of the Fourier transform of the image associated with the mask 104 to enhance the image 108. For example, the optical element could shift the frequency components of all uniformly spaced-apart parallel lines in the Fourier plane to enhance the image resolution of all of these parallel lines. Suitably, the imaging system will have a converging optical element after the focal plane to back transformation at the plane of the image.

The phase-shifting element 112 may also conveniently incorporate nonphase elements to block or attenuate selected frequency components to further improve the quality of the final image 108 such as disclosed in U.S. Pat. No. 4,947,413, the disclosure of which is incorporated herein by reference. For example, the frequency component corresponding to the DC component could be blocked to enhance contrast; or the frequency component, due to unwanted scattering of light or optical aberrations, could be blocked to improve the image quality or depth of focus.

Figure 1B:
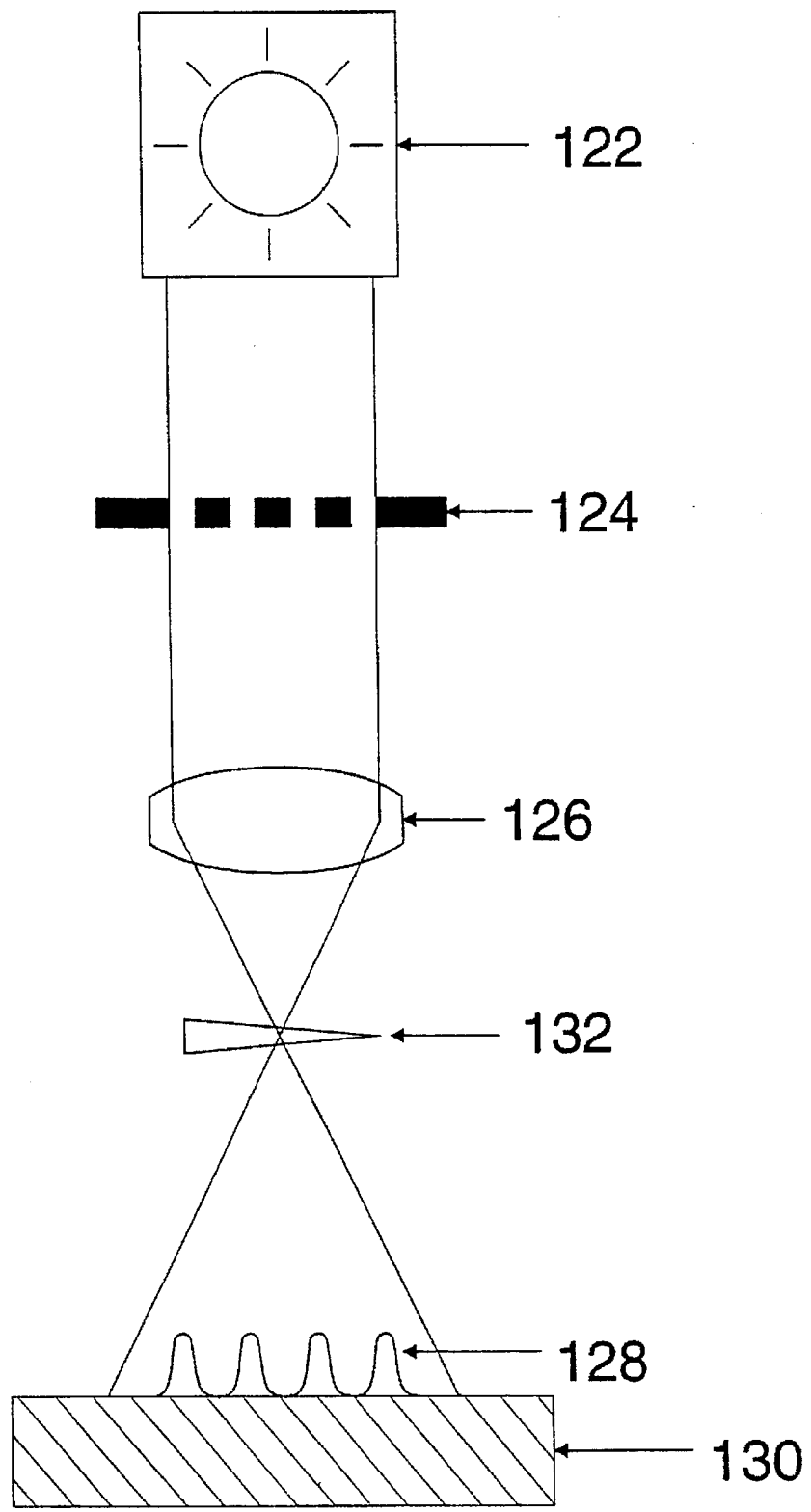
FIG. 1B is a schematic representation of a lithographic system incorporating a phase-shifting element (e.g., a wedge) at the focal plane.

Another embodiment of the lithographic imaging system of the present invention is depicted in FIG. 1B. A light source 122 is shown illuminating a standard transmission mask 124. The mask 124 is then imaged through converging optical element 126 to produce a lithographic image 128 on a substrate 130. A Fourier transform of the spatial frequencies of mask 124 is produced in the focal plane of the optical element 126. A symmetrical (45° slope) wedge-shaped focal plane phase-shifting optical element 132 is positioned at the focal plane of the optical element 126, creating a gradual phase shift as a function of frequency.

The phase-shifting optical element can be formed in other shapes having continuous or discrete feature changes. Suitable optical surfaces which can be readily made as a phase-shifting optical element are spherical and aspherical shapes such as ellipsoids, paraboloids, and hyperboloids of revolution. These shapes could be used as a single surface with the second surface being an optical flat or in combination on two or more surfaces of the phase-shifting element. Suitable symmetrically-shaped elements having continuous feature changes include pyramid parabolic or cone-shaped elements. Discrete feature changes include steps and the like.

Phase shifting can also be introduced into the phase-shifting optical element by changing the refractive index of the material (e.g., ion implantation) or addition of another material with a different refractive index. Phase-shifting optical elements are well known to those skilled in the art, and suitable phase-shifting optical elements for use in the present invention will be known to those skilled in the art. A phase-shifting element may conveniently be made of a high optical index material, such as quartz, sapphire, or glasses such as BK7 and BaK2. The phase-shifting optical element (e.g., 45° wedge) will result in enhancement of the image quality (e.g., parallel spaced-apart lines). If further enhancement of the image is desired, it can be achieved by an iterative process of (i) determining Fourier transform (FT) of the mask and the FT of the desired image, and (ii) analyzing (deconvolving) the two FTs to determine an FT phase shift which would be a first approximation to the phase shift desired to achieve the additional enhancement. The Fourier transform of mask features can be calculated by standard Fourier transform algorithms such as the fast Fourier transform, the discrete Fourier transform, or full numeric evaluation of the appropriate Fourier transform integrals. Such calculations are disclosed in Levenson et al., *IEEE Transactions on Electron Devices*, Vol. 29, December 1982, the disclosure of which is incorporated herein by reference. This first approximation FT phase-shifting optical element can then be iteratively modified and evaluated by successive approximations using computer simulation to produce an optical element having the desired image enhancement. For example, using a parabolic-shaped mask enhances the image, but the high-frequency components cause some accompanying image distortion. The FT parabolic-shaped mask could then be modified (e.g., by the addition of linear components) to achieve less shift in the high frequency.

Figure 2A:
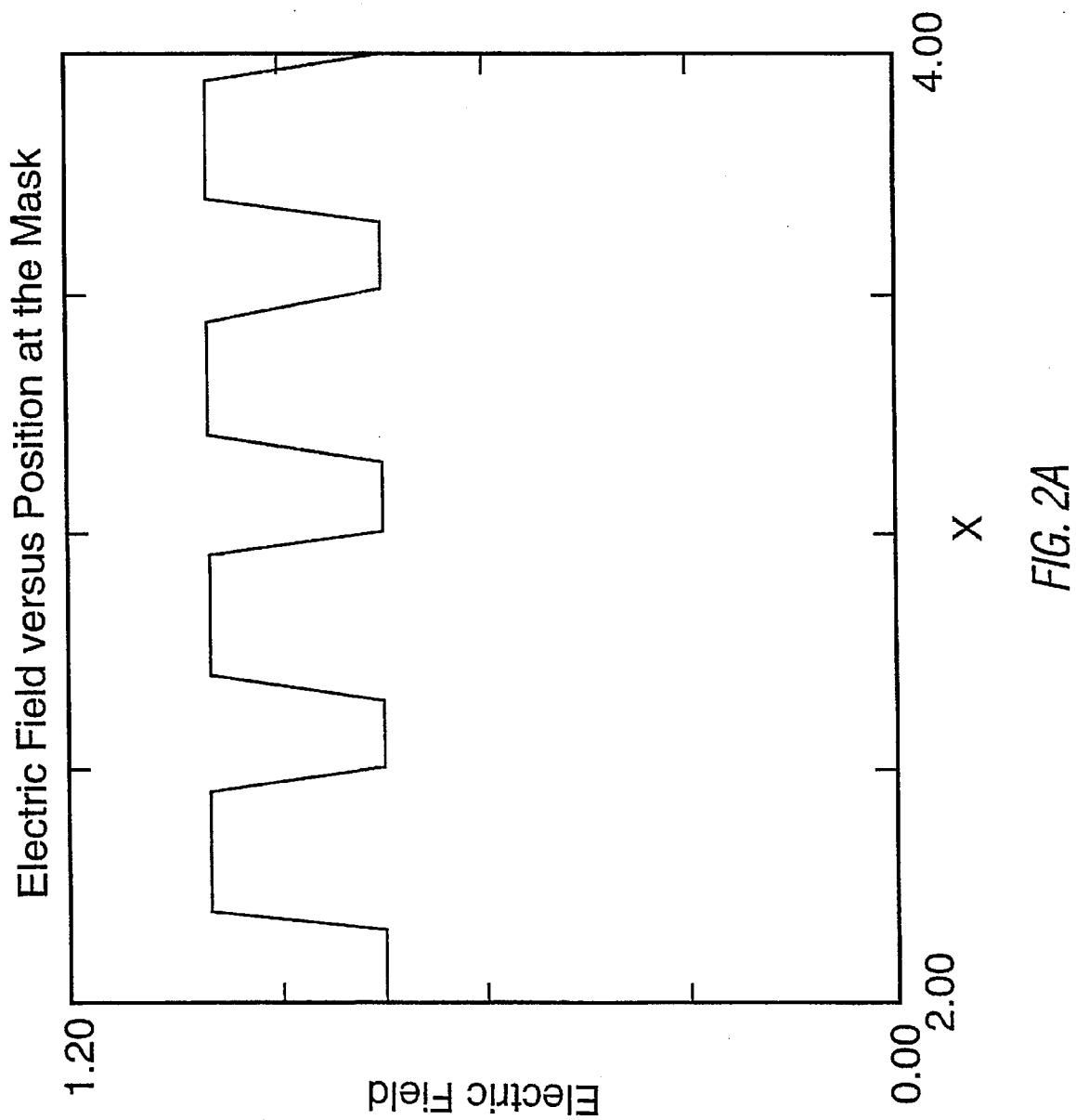
FIG. 2A depicts the electric field of a particular image generated by a conventional lithographic system.
Figure 2B:
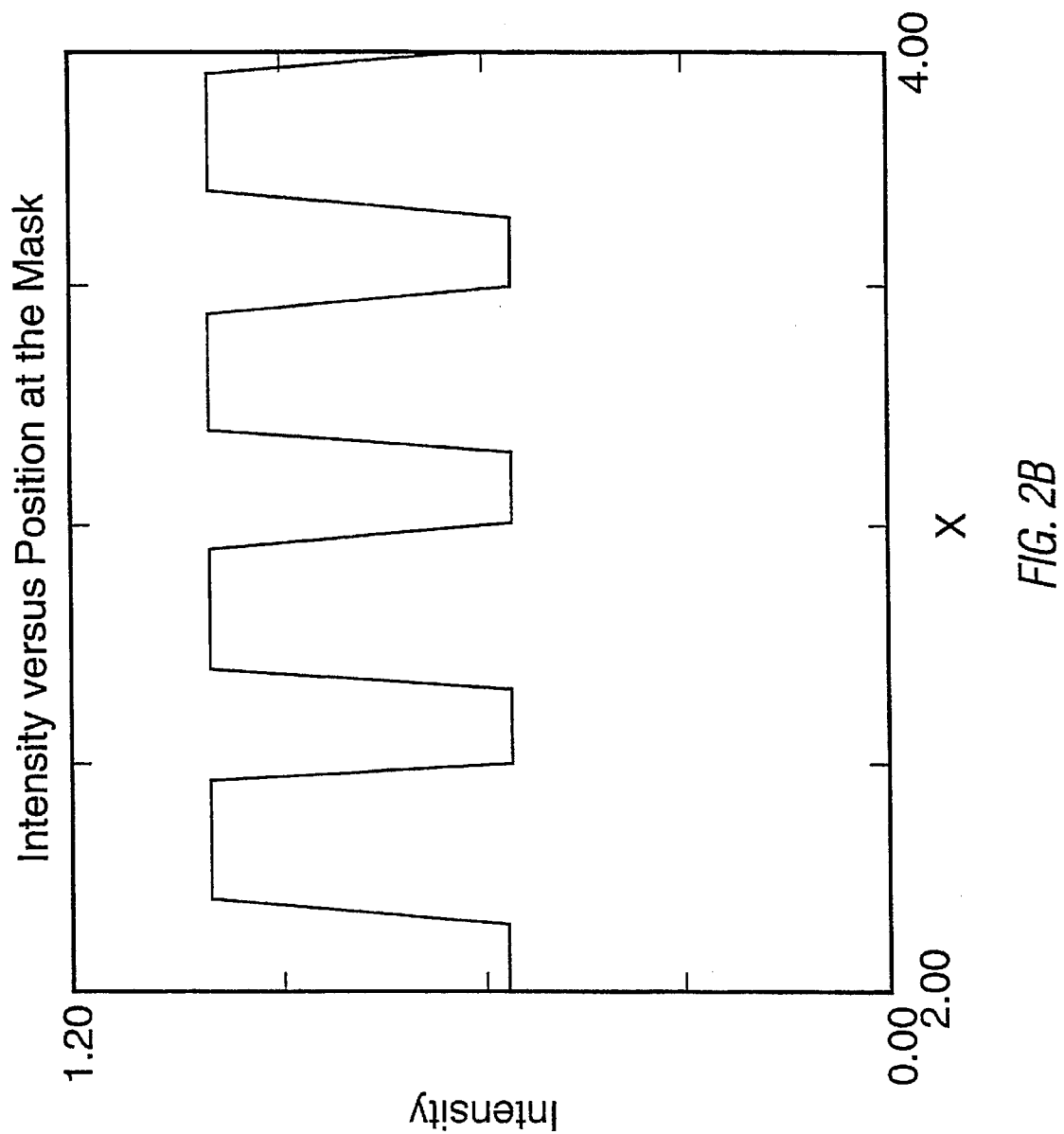
FIG. 2B depicts the illumination intensity of the image of FIG. 2A.
Figure 2C:
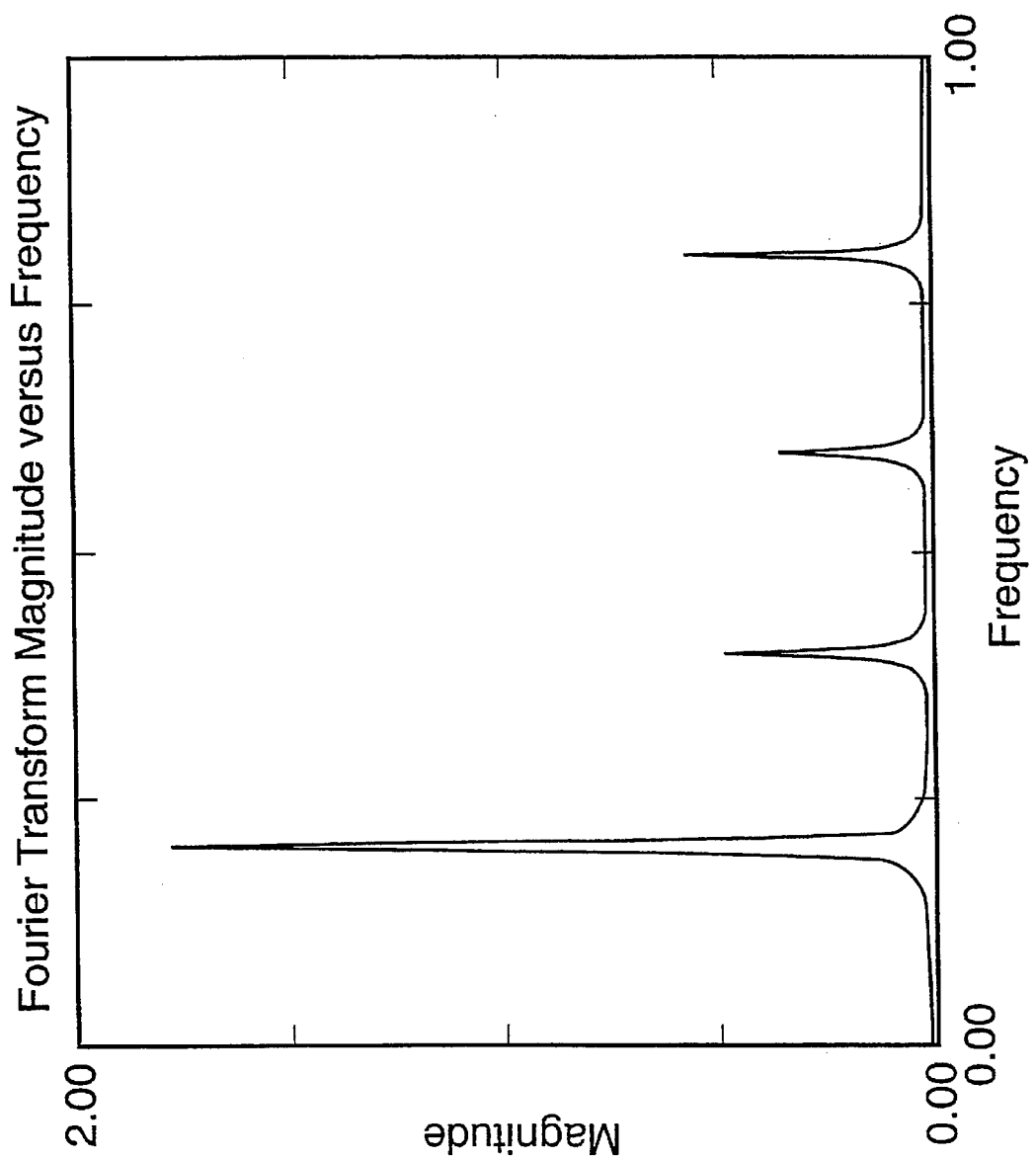
FIG. 2C depicts the Fourier transform magnitude of the electric field of the image of FIG. 2A.
Figure 2D:
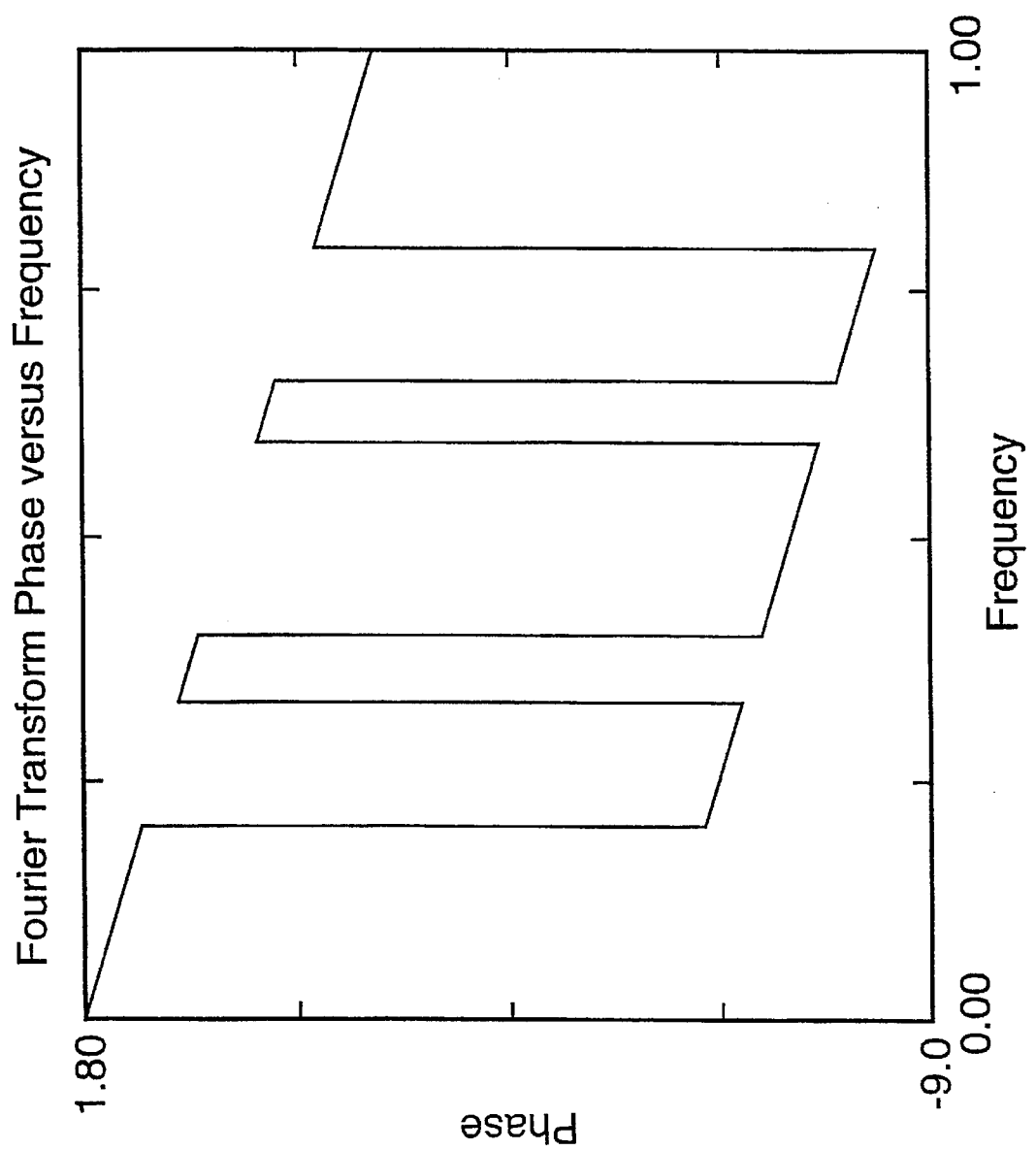
FIG. 2D depicts the Fourier transform phase of the electric field of the image of FIG. 2A.

As an illustration of how the above-described embodiment generates a phase-shifted image, consider a transmission mask 124 comprising a number of equally-spaced lines. FIGS. 2A and 2B depict, respectively, the electric field and the intensity of the illumination (e.g., light) of the image at the mask generated by a conventional lithographic system. Only four lines of the features from the transmission mask 124 are shown in FIGS. 2A and 2B for the reason of clarity. Note the large background intensity in FIG. 2B. FIG. 2C shows the Fourier transform versus arbitrary frequency at the focal plane of the image of FIG. 2A as calculated by fast Fourier transform. FIG. 2D depicts the Fourier transform phase of the electric field at the focal plane.

Figure 2E:
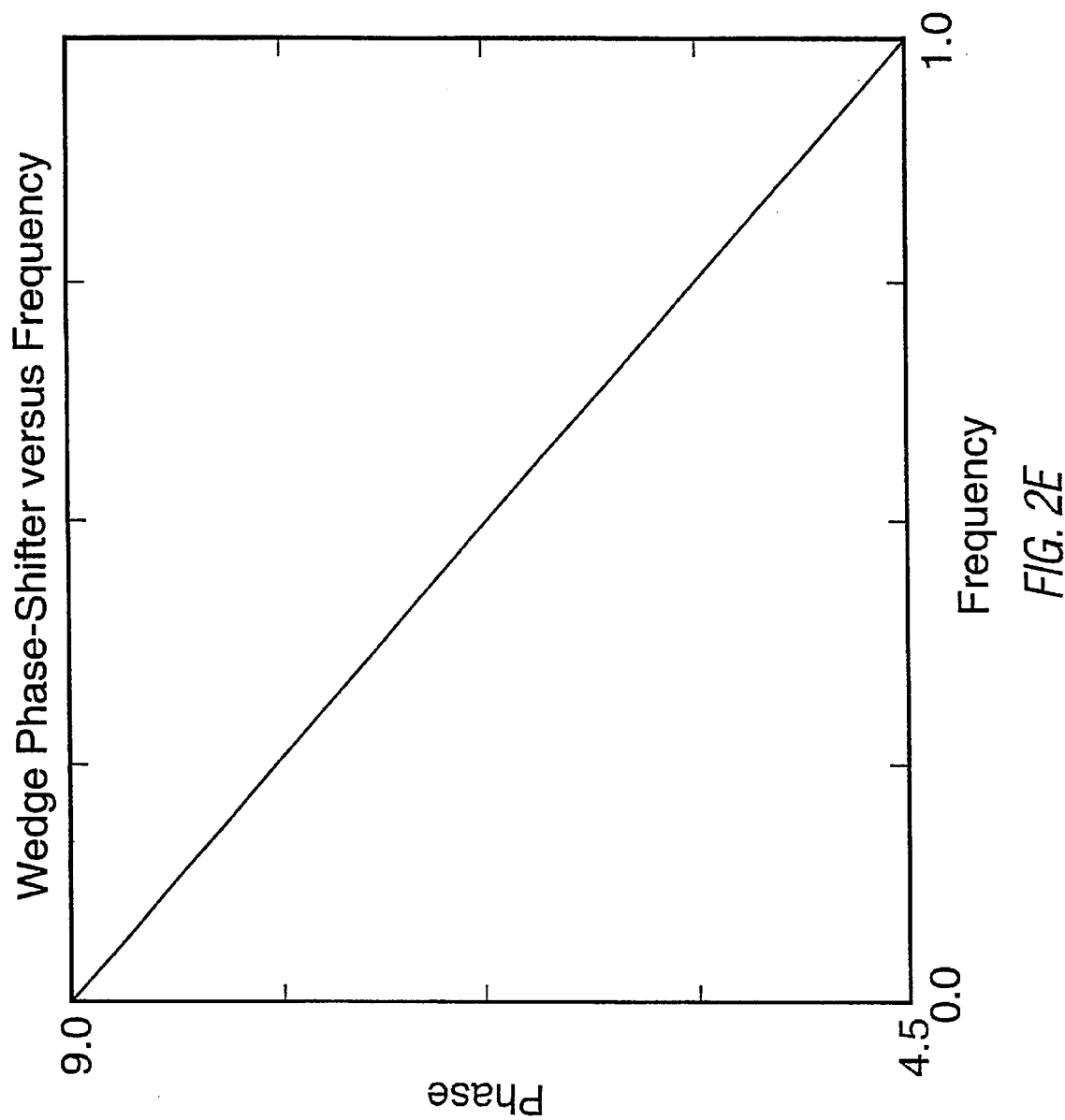
FIG. 2E depicts the phase shift generated at the focal plane of the lithographic system.
Figure 2F:
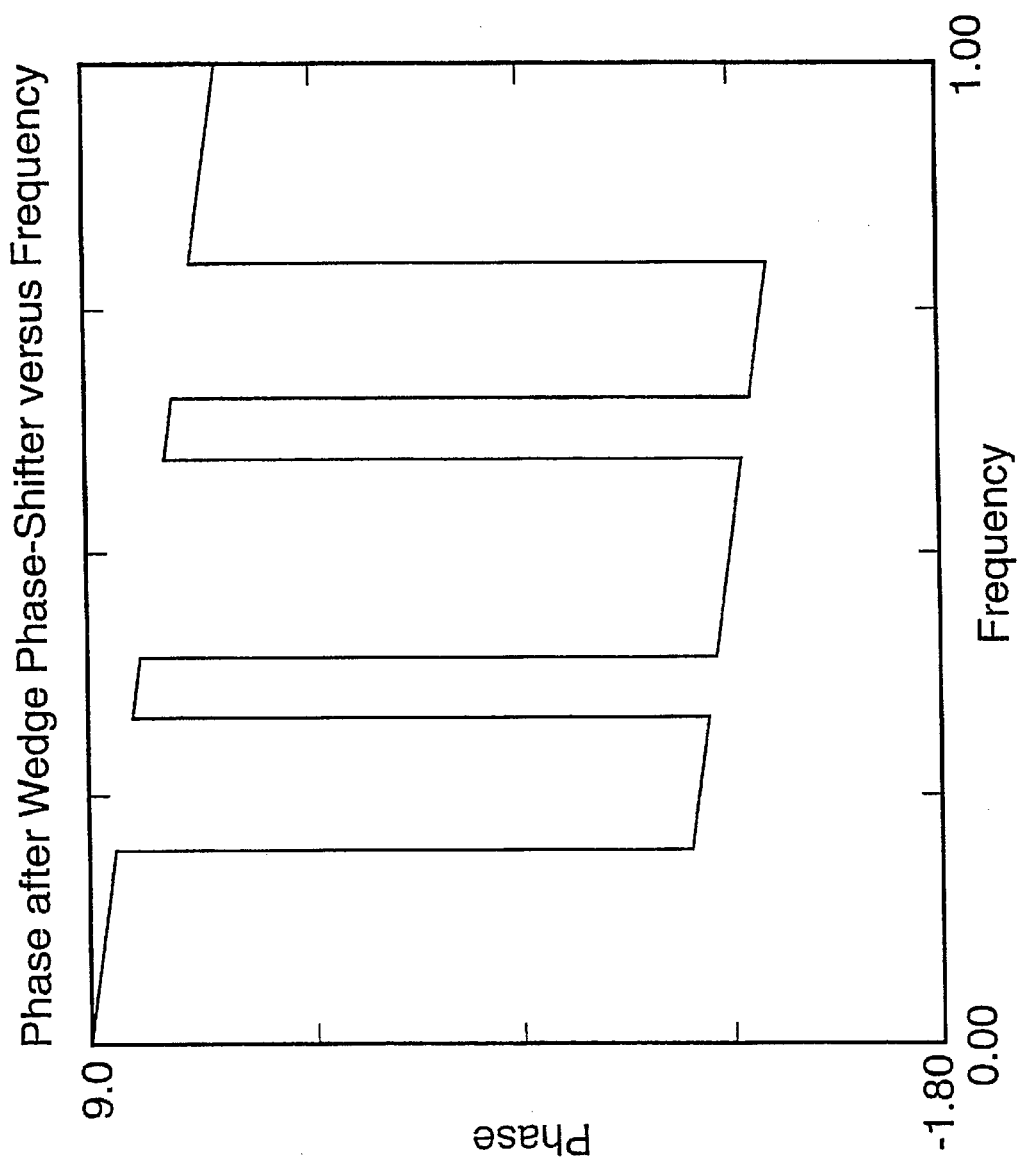
FIG. 2F depicts the shifted phase of the electric field of FIG. 2A.
Figure 2G:
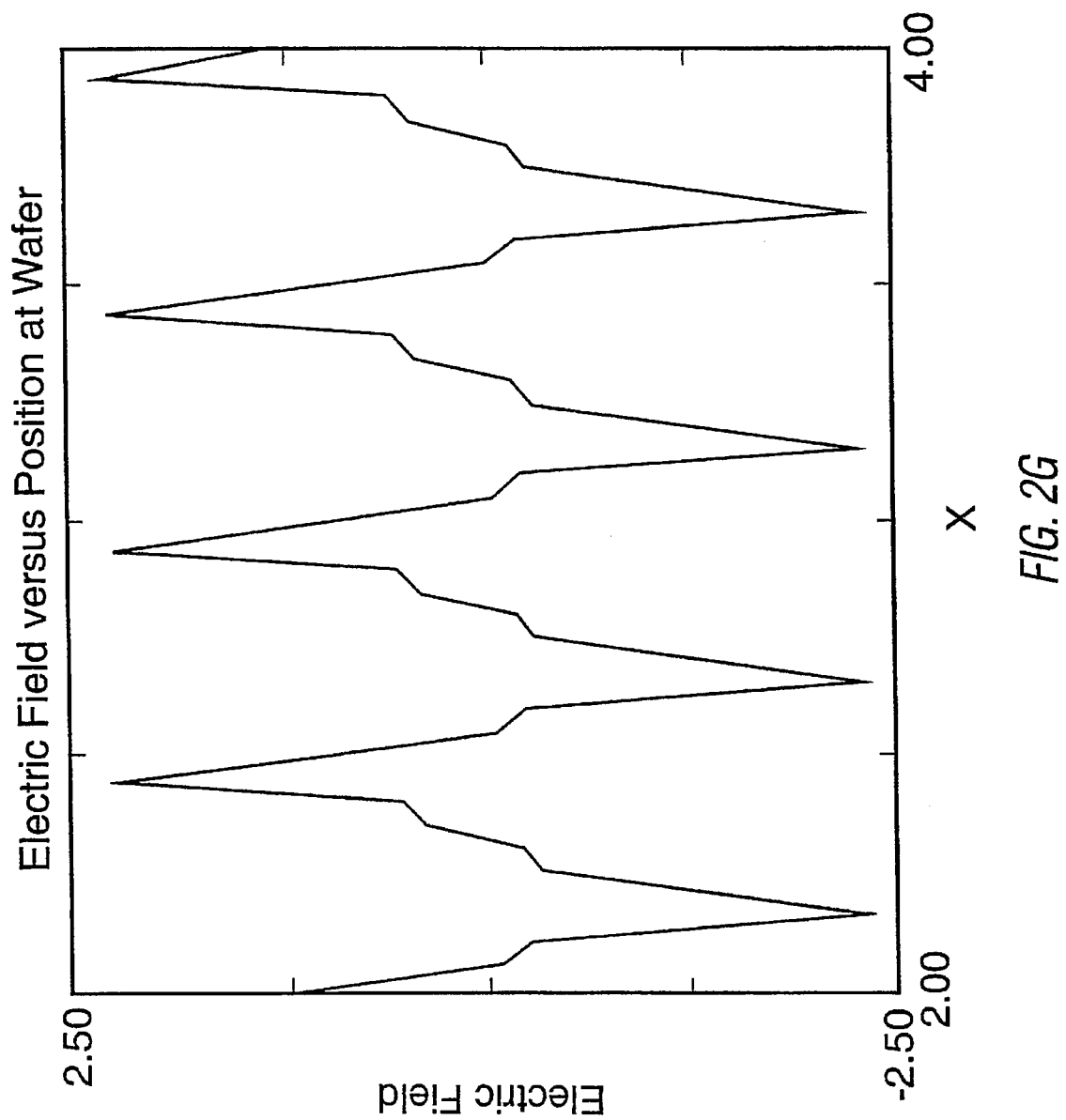
FIG. 2G depicts the phase-shifted electric field at the wafer of the image of FIG. 2A.

The placement of the wedge phase-shifter 132 at the focal plane of the imaging optics 126 introduces a frequency-dependent phase shift of 45° per arbitrary frequency unit, as depicted in FIG. 2E, into the Fourier transform image at the focal plane, resulting in the "shifted" phase of the electric field as depicted in FIG. 2F. Finally, the phase-shifted Fourier image at the focal plane results in the phase-shifted image 128 having an electric field at the wafer as depicted in FIG. 2G and a light intensity at the wafer as depicted in FIG. 2H.

Figure 2H:
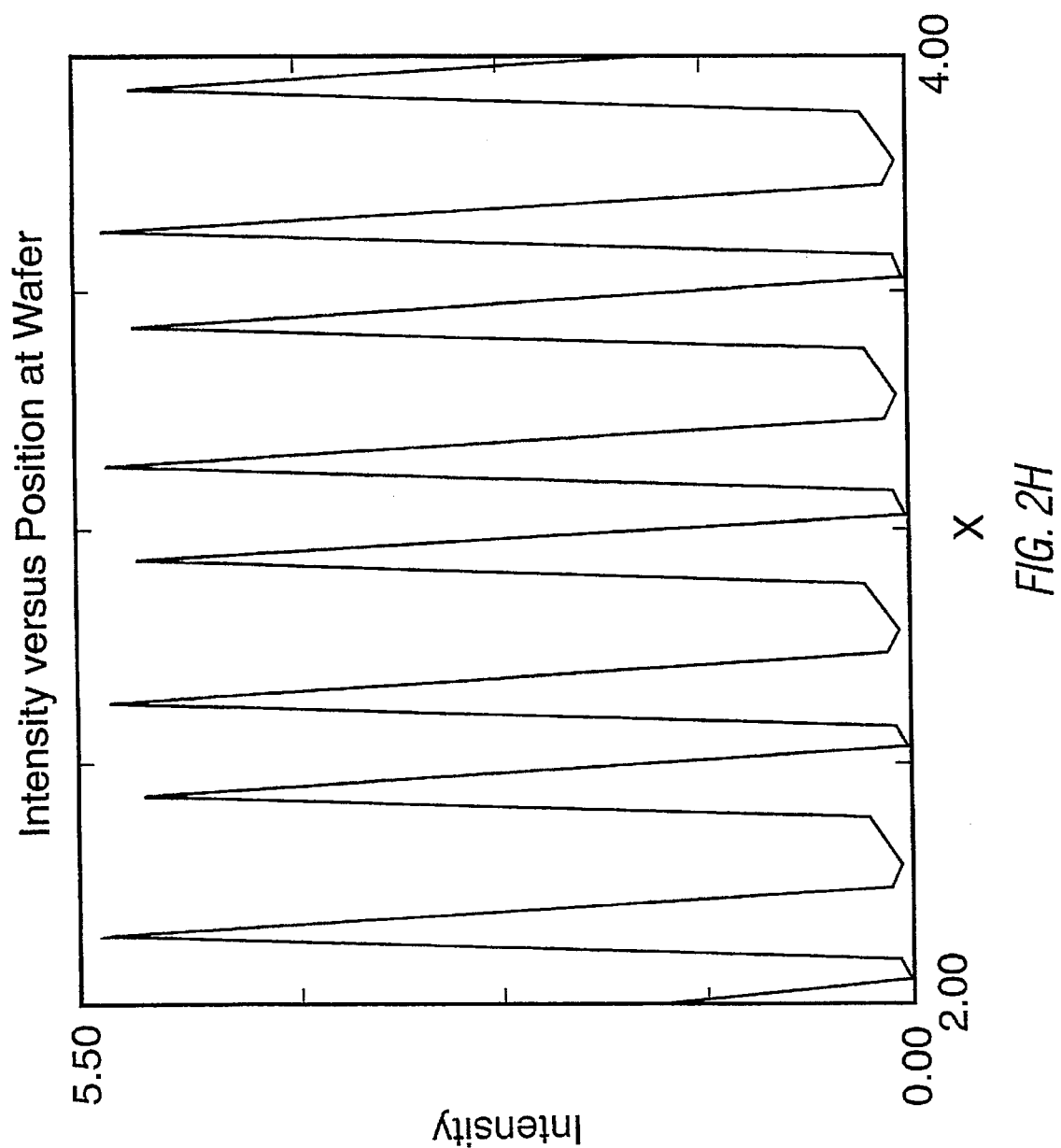
FIG. 2H depicts the illumination intensity at the wafer of the phase-shifted image of FIG. 2G.
Figure 3A:
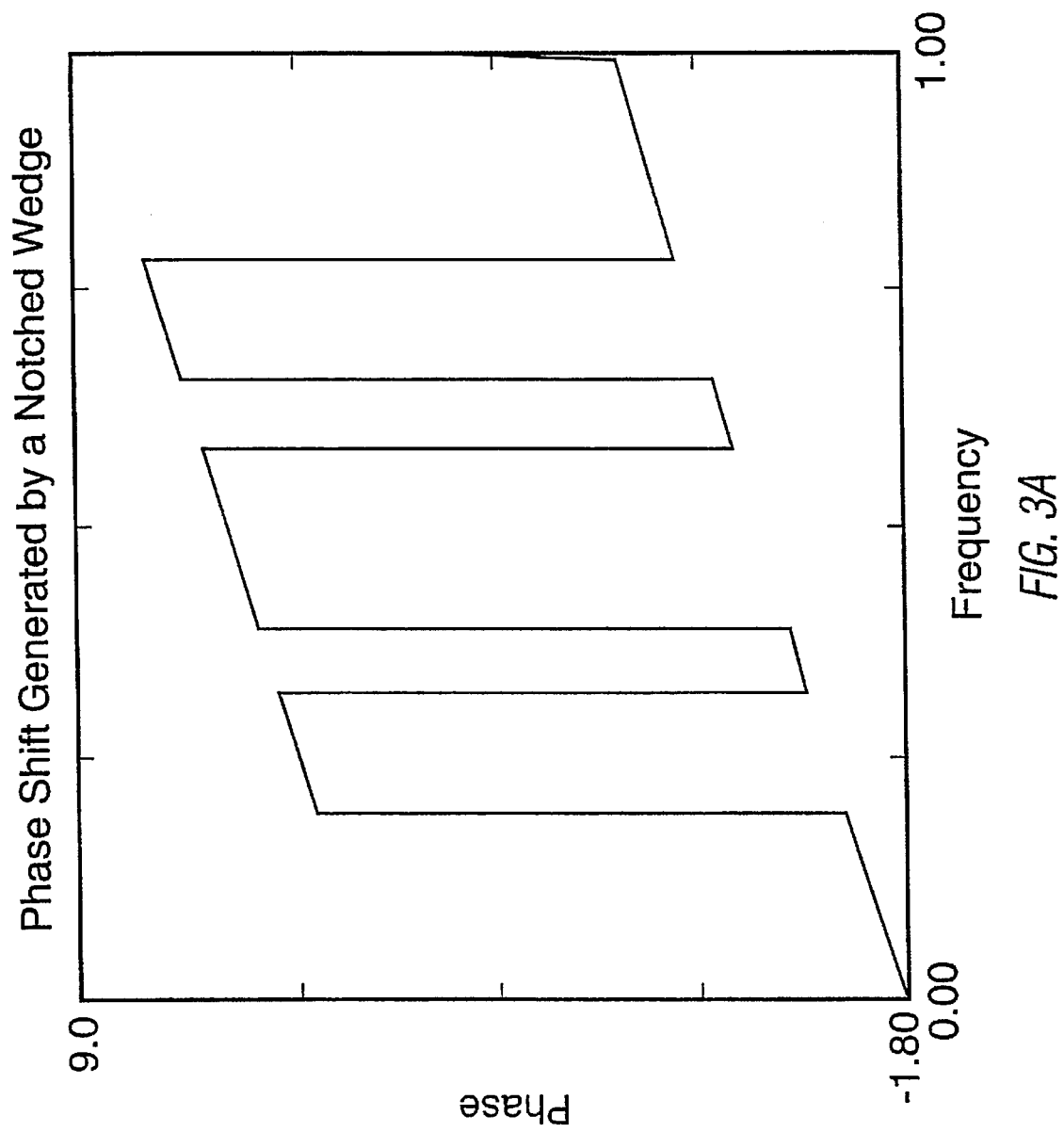
FIG. 3A depicts the phase shift generated by a phase-shifting optical element.
Figure 3B:
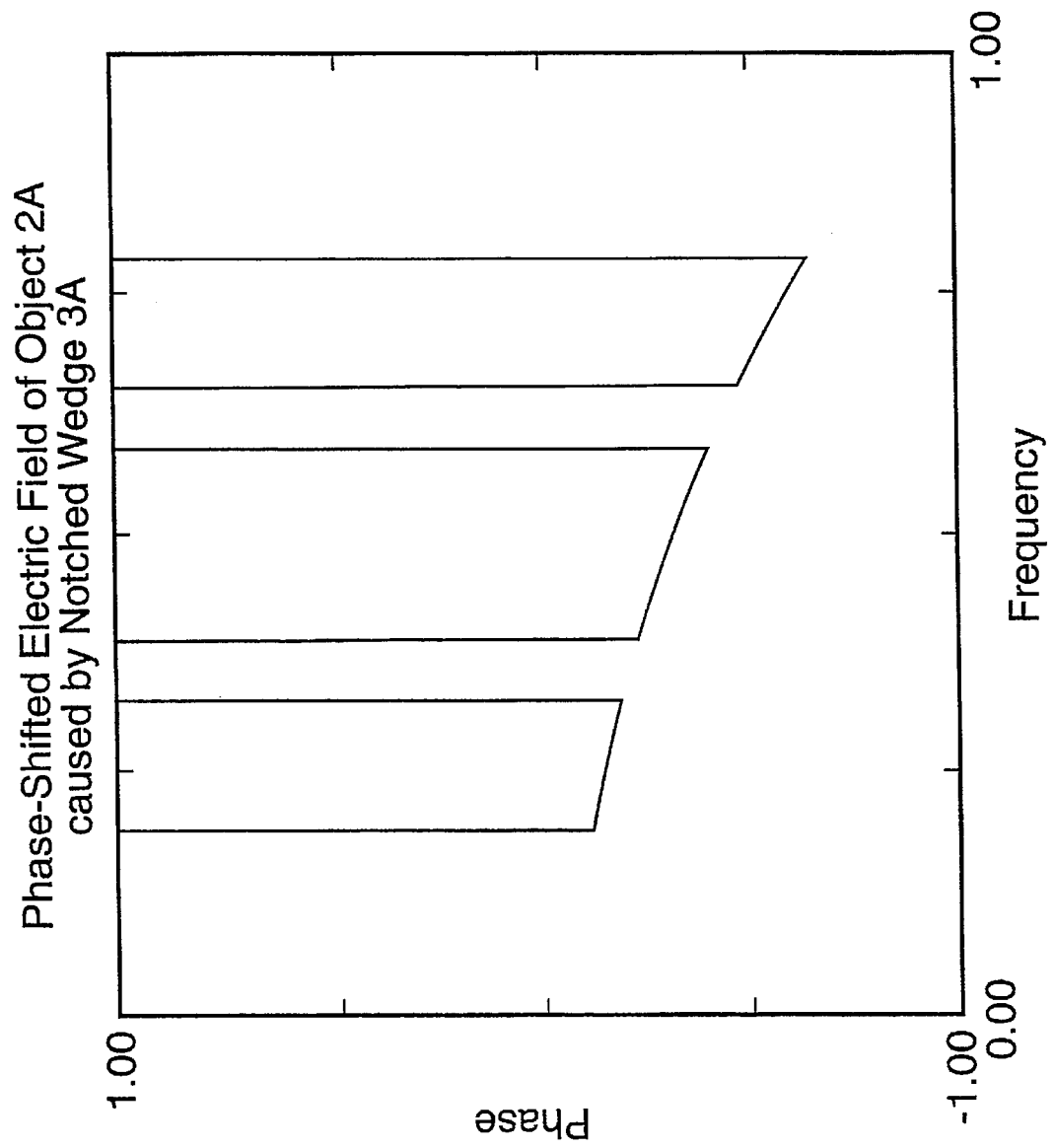
FIG. 3B depicts the shifted phase of the electric field of FIG. 2A.
Figure 3C:
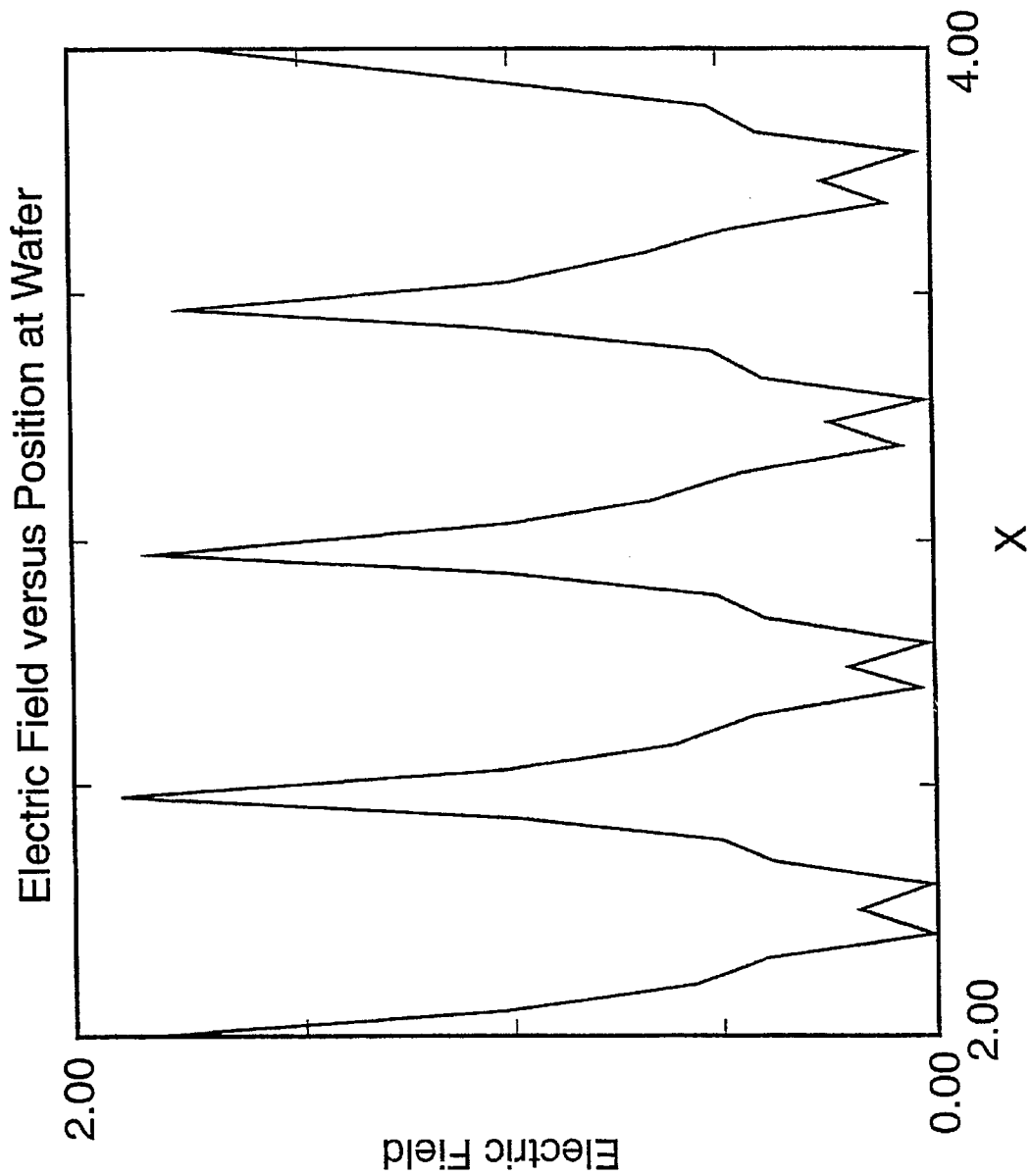
FIG. 3C depicts the phase-shifted electric field at the wafer of the image of FIG. 2A.
Figure 3D:
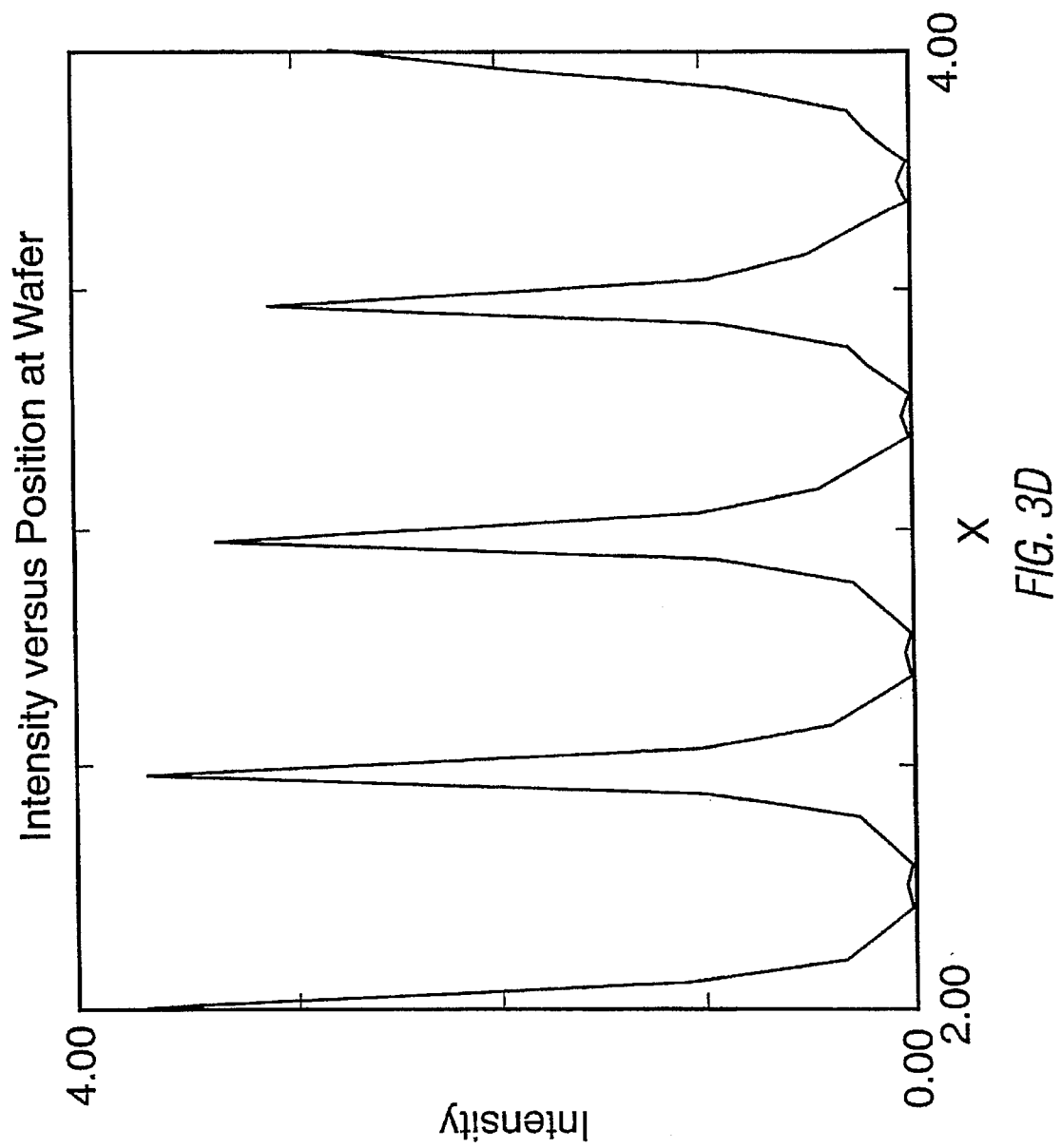
FIG. 3D depicts the illumination intensity at the wafer of the phase-shifted image of FIG. 3C.

A comparison of FIGS. 2B and 2H shows significant improvements in image quality resulting from the present invention. The image in FIG. 2H has substantially less background intensity and substantially narrower linewidths. Using a wedge phase-shifted optical element, it is possible to improve contrast of the image even when there is a large background intensity due to the use of a standard transmission mask or due to other light transmitted or scattered in the optical system.

As another example illustrating the present invention, in FIG. 3 there is shown a phase-shifting optical element which has discrete steps in addition to a linear continuous phase shifting (e.g., a wedge which is stepped or notched). The dimension of the discrete change will suitably be $\lambda/k \pm n\lambda$ where k=2,4 or the like and n=0,1,2 .... The placement of the "stepped" or "notched" wedge phase-shifting element at the focal plane of the imaging optics 126 introduces the frequency-dependent phase shift as depicted in FIG. 3A into the Fourier transform image at the focal plane, resulting in the "shifted" phase of the electric field depicted in FIG. 3B. Finally, the phase-shifted Fourier image at the focal plane results in the phase-shifted image 128 having an electric field as depicted in FIG. 3C and an illumination intensity as depicted in FIG. 3D. A comparison of FIGS. 2B and 3D indicates that the line features corresponding to FIG. 2B can be imaged with greatly enhanced resolution. A comparison of FIGS. 2H and 3D readily shows that, by using focal plane phase shifters having discrete dimension changes, the resultant image can be enhanced.

Figure 4A:
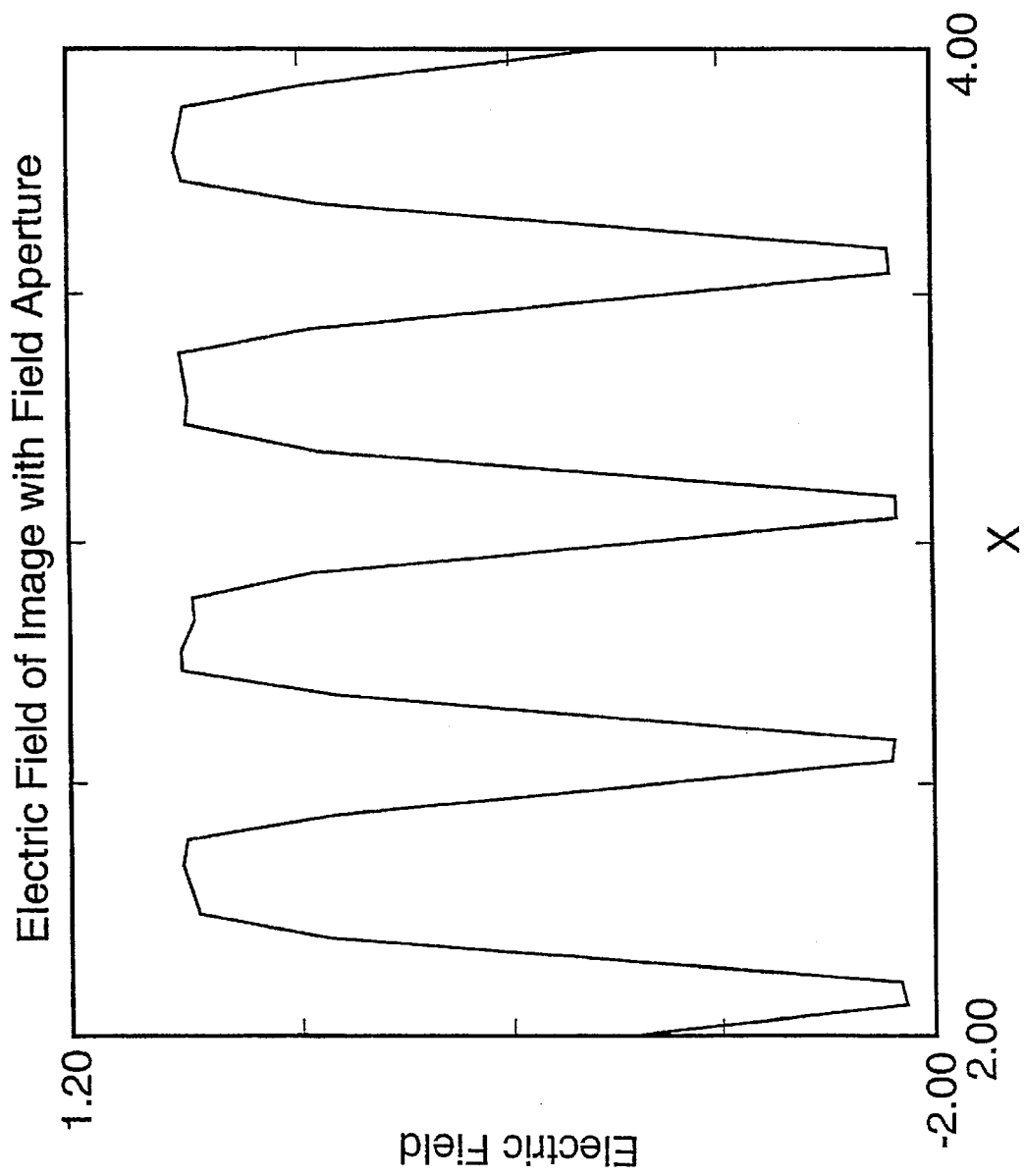
FIG. 4A depicts the electric field of an image generated with imaging optics having a field aperture.
Figure 4B:
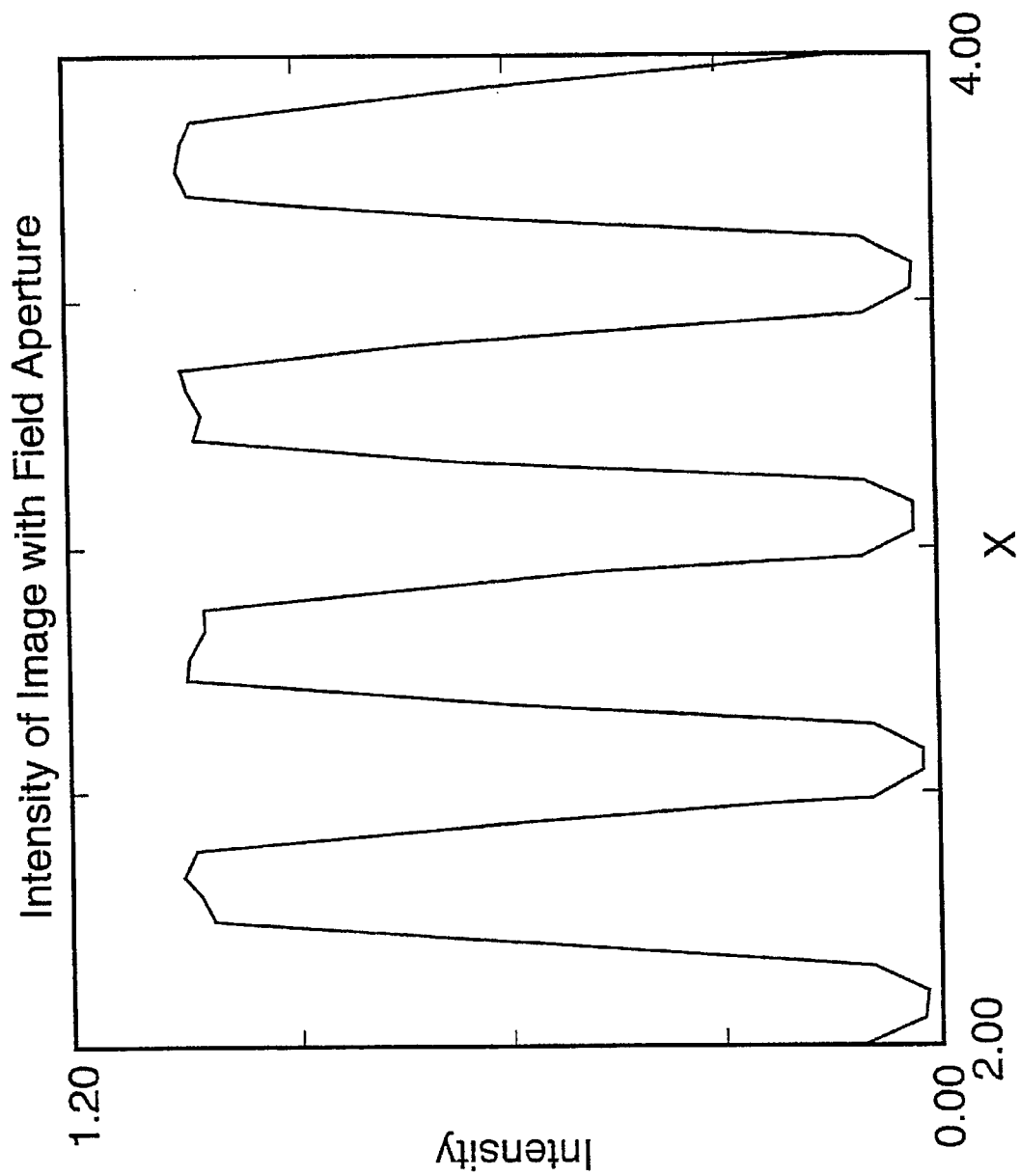
FIG. 4B depicts the illumination intensity of the image of FIG. 4A.
Figure 4C:
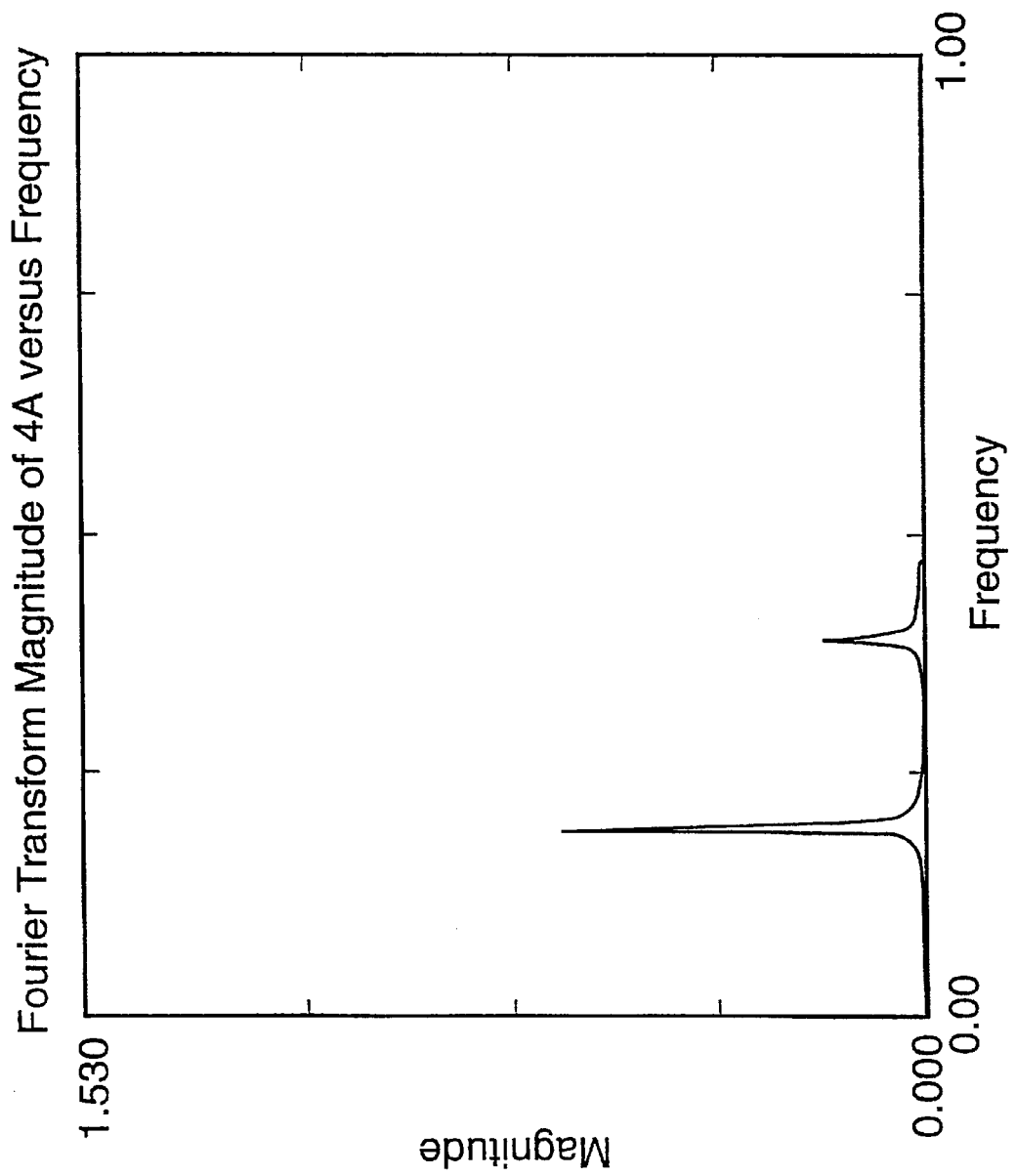
FIG. 4C depicts the Fourier transform magnitude of the electric field of the image of FIG. 4A.
Figure 4D:
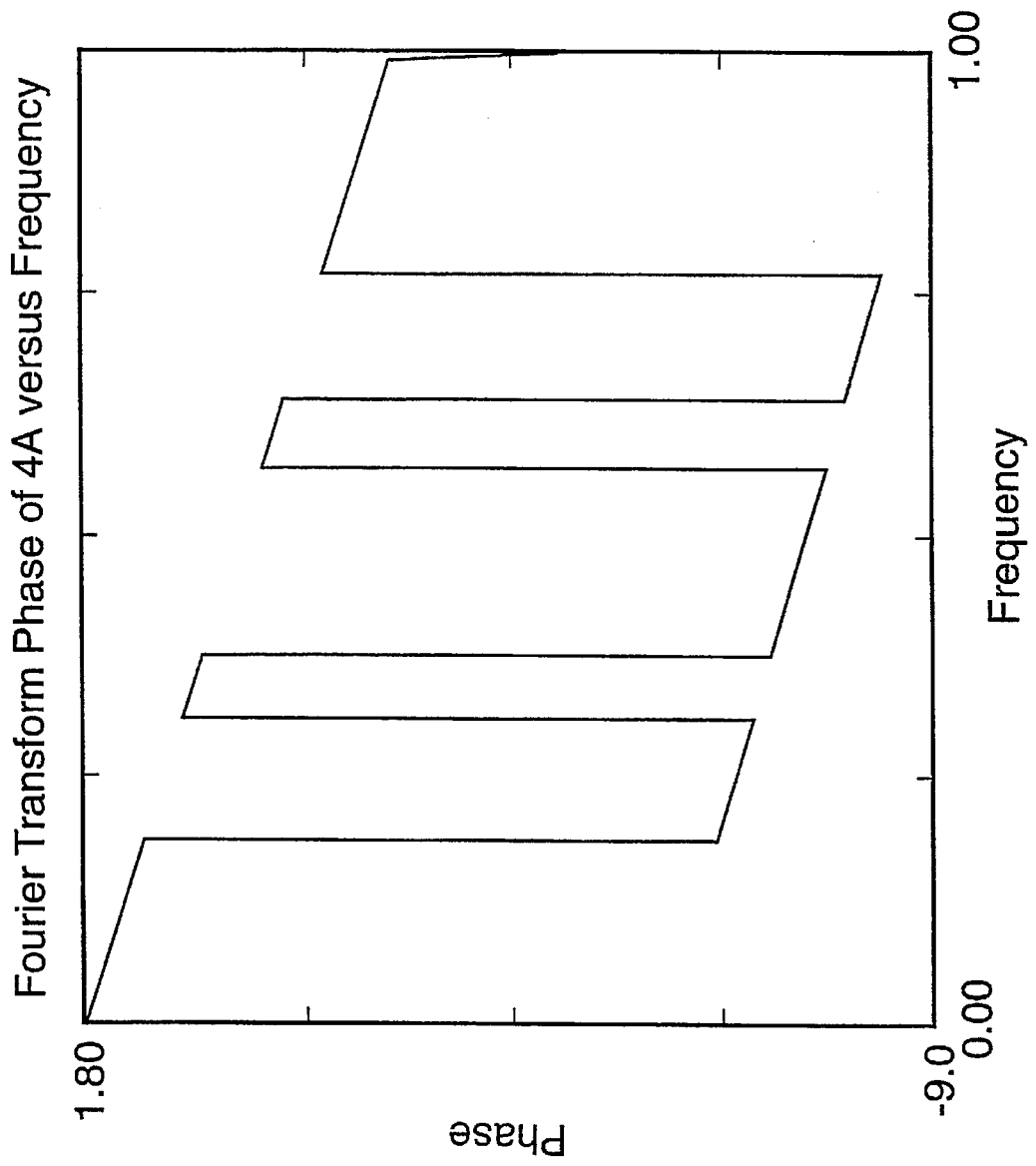
FIG. 4D depicts the Fourier transform phase of the electric field of the image of FIG. 4A.
Figure 4E:
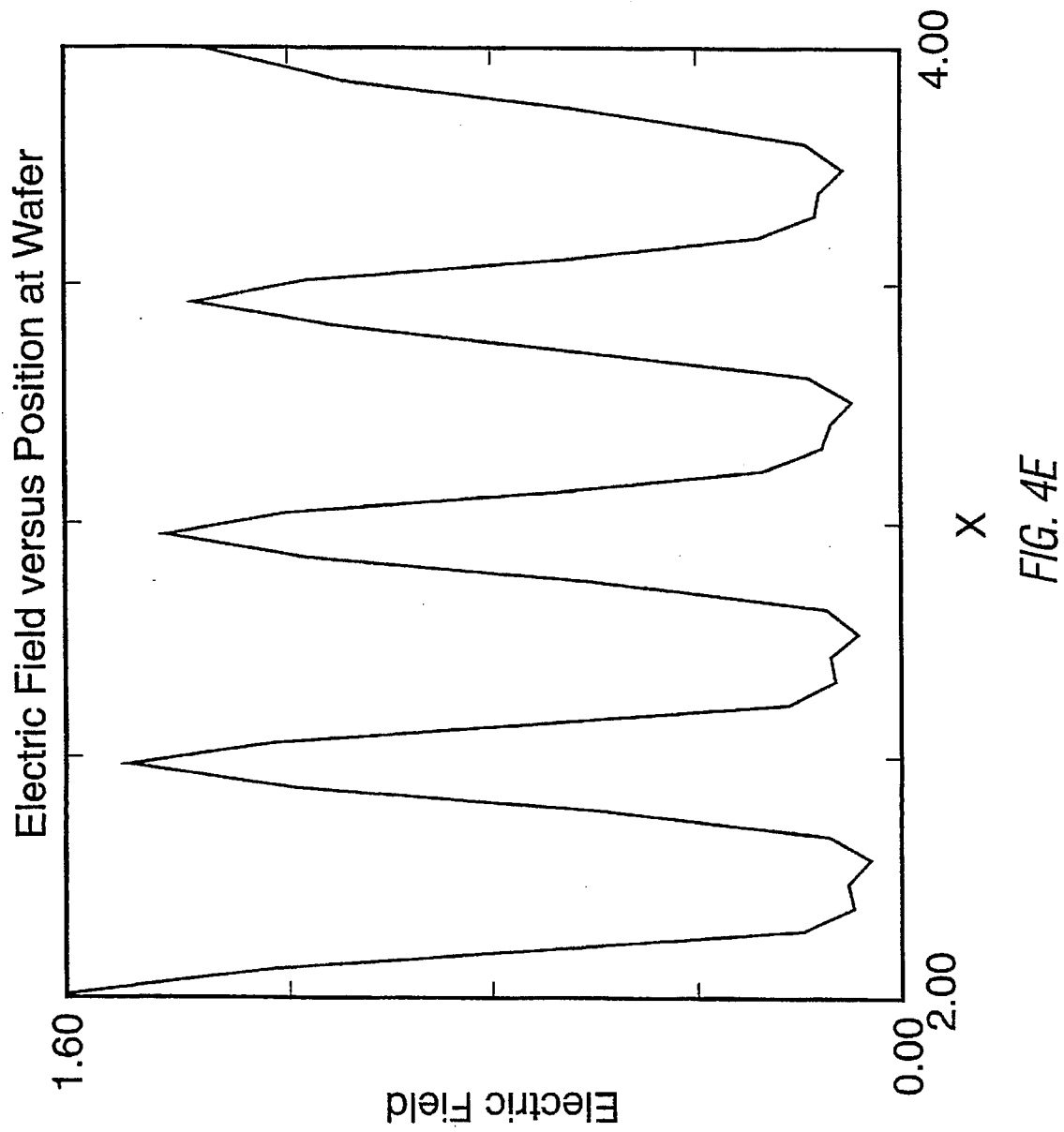
FIG. 4E depicts the phase-shifted electric field at the wafer of the image of FIG. 2A caused by the presence of the notched wedge of FIG. 3A.
Figure 4F:
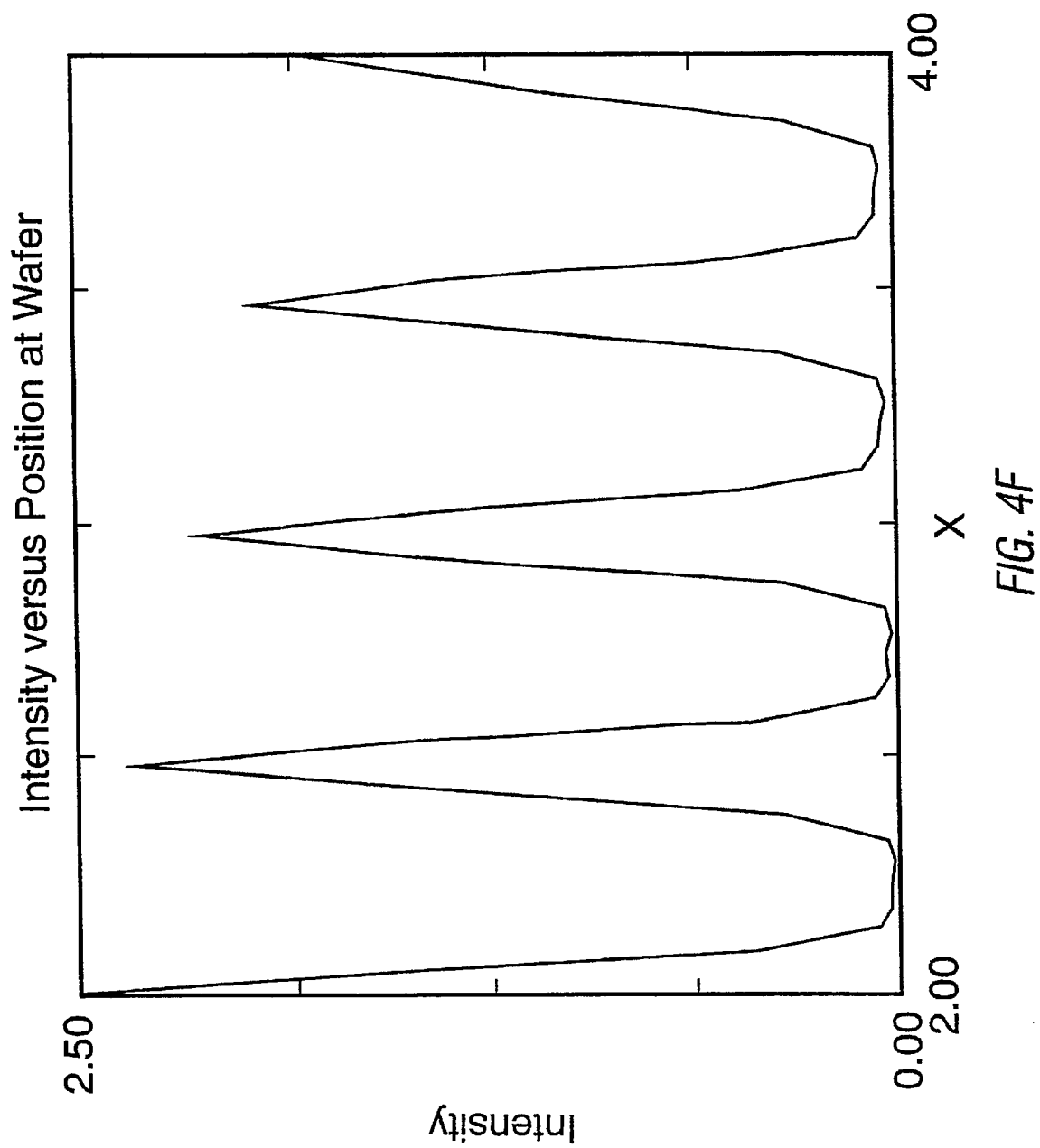
FIG. 4F depicts the illumination intensity at the wafer of the phase-shifted image of FIG. 4E.

As still another example illustrating the present invention, consider again the lithography system depicted in FIG. 1B where a field aperture is present in the imaging optics. The field aperture has the effect of limiting the frequency components of the light passing through the transmission mask and accordingly reduces the resultant resolution in the image. FIGS. 4A and 4B depict, respectively, the electric field and the intensity distribution that would be generated by a conventional lithographic system. FIGS. 4C and 4D depict, respectively, the magnitude and the phase of the electric field at the focal plane. Notice that while FIG. 4D is identical to FIG. 2D, a comparison of FIGS. 4C and 2C clearly shows the loss of high-frequency components originally present in the transmission mask 124 owing to the presence of the field aperture in the imaging optics. Finally, the phase-shifted Fourier image at the focal plane results in the phase-shifted image at the wafer having an electric field as depicted in FIG. 4E and a light intensity at the wafer as depicted in FIG. 4F. The resolution and contrast of the image are enhanced.

In summary, focal plane phase-shifting optical elements can be used to improve the contrast and resolution of mask features having a broad spectrum of spatial frequency components. Focal plane shifting elements having discrete dimension changes superimposed on a continuous dimension change can be applied to repetitive mask features having only a few spatial frequency components. Both types of focal plane phase shifters can be used simultaneously in the same focal plane or in successive focal planes of a conventional lithographic imaging system.

Those skilled in the art will recognize that the foregoing description has been presented for the purposes of illustration and description only. It is not intended to be exhaustive or to limit the invention to the precise forms disclosed, and many modifications and variations are possible in light of the above teachings. Thus, the embodiments set forth herein are presented in order to explain the principles of the present invention and its practical applications to thereby enable others skilled in the art to best utilize the present invention in various embodiments, modifications, and equivalents as are suited to the particular use contemplated.

What is claimed is:

1. A lithographic imaging system, comprising:

(a) a radiation source;

(b) a mask having features with repetitive elements;

(c) a converging optical element having a focal plane; and (d) a phase-shifting optical element disposed at the focal plane.

2. The system of claim 1, wherein the radiation source is an ultraviolet radiation source.

3. A method of forming phase-shifted images in a lithographic imaging system comprising a mask, having features with repetitive elements, a converging optical element having a focal plane, and a phase-shifting optical element disposed at the focal plane, comprising the steps of:

(a) irradiating the mask; and (b) passing the radiation passing through the mask, the converging optical element and the phase-shifting optical element to generate phase-shifted images.

4. The method of claim 3, wherein the mask is irradiated with ultraviolet radiation.

* * * * *